United States Patent
Tocalli

(10) Patent No.: US 11,476,871 B2
(45) Date of Patent: Oct. 18, 2022

(54) EFFICIENT ENCODING FOR NON-BINARY ERROR CORRECTION CODES

(71) Applicant: GYLICON LTD, London (GB)

(72) Inventor: Claudio Tocalli, Forcola (IT)

(73) Assignee: Gylicon Ltd, London (GB)

(*) Notice: Subject to any disclaimer, the term of this patent is extended or adjusted under 35 U.S.C. 154(b) by 0 days.

(21) Appl. No.: 17/031,066

(22) Filed: Sep. 24, 2020

(65) Prior Publication Data
US 2022/0094372 A1 Mar. 24, 2022

(51) Int. Cl.
*H03M 13/11* (2006.01)
*H03M 13/15* (2006.01)
*H03M 13/27* (2006.01)

(52) U.S. Cl.
CPC ........ *H03M 13/116* (2013.01); *H03M 13/118* (2013.01); *H03M 13/155* (2013.01); *H03M 13/2735* (2013.01)

(58) Field of Classification Search
None
See application file for complete search history.

(56) References Cited

U.S. PATENT DOCUMENTS

| 9,236,886 B1* | 1/2016 | Zhu ................... H03M 13/611 |
| 9,768,806 B2* | 9/2017 | Myung ............. H03M 13/2792 |
| 10,833,704 B1* | 11/2020 | Walke ............... H03M 13/6519 |

* cited by examiner

*Primary Examiner* — April Y Blair
*Assistant Examiner* — Matthew W Wahlin
(74) *Attorney, Agent, or Firm* — Janeway Patent Law PLLC; John Janeway

(57) ABSTRACT

Encoding bits with a Q-ary linear error correction code defined over a binary-extension Galois field GF(2k), defined by a quasi-cyclic parity-check matrix comprising: first, second and third circulant sub-matrices comprising respective circulants respectively having first, second and third shifts and defined by first, second and third parameters belonging to the Galois field GF(2k), the second shift equal to a difference between a number of rows of each circulant and the first shift. A first set of parity-check bits is determined according to a fourth circulant having a shift equal to a difference between the number of rows and the first and third shifts and defined by the multiplicative inverse of a product between the first and third parameters, and to the second and third circulant sub-matrices. A second set of parity-check bits is determined according to the first set of parity-check bits and the first and second circulant sub-matrices.

12 Claims, 7 Drawing Sheets

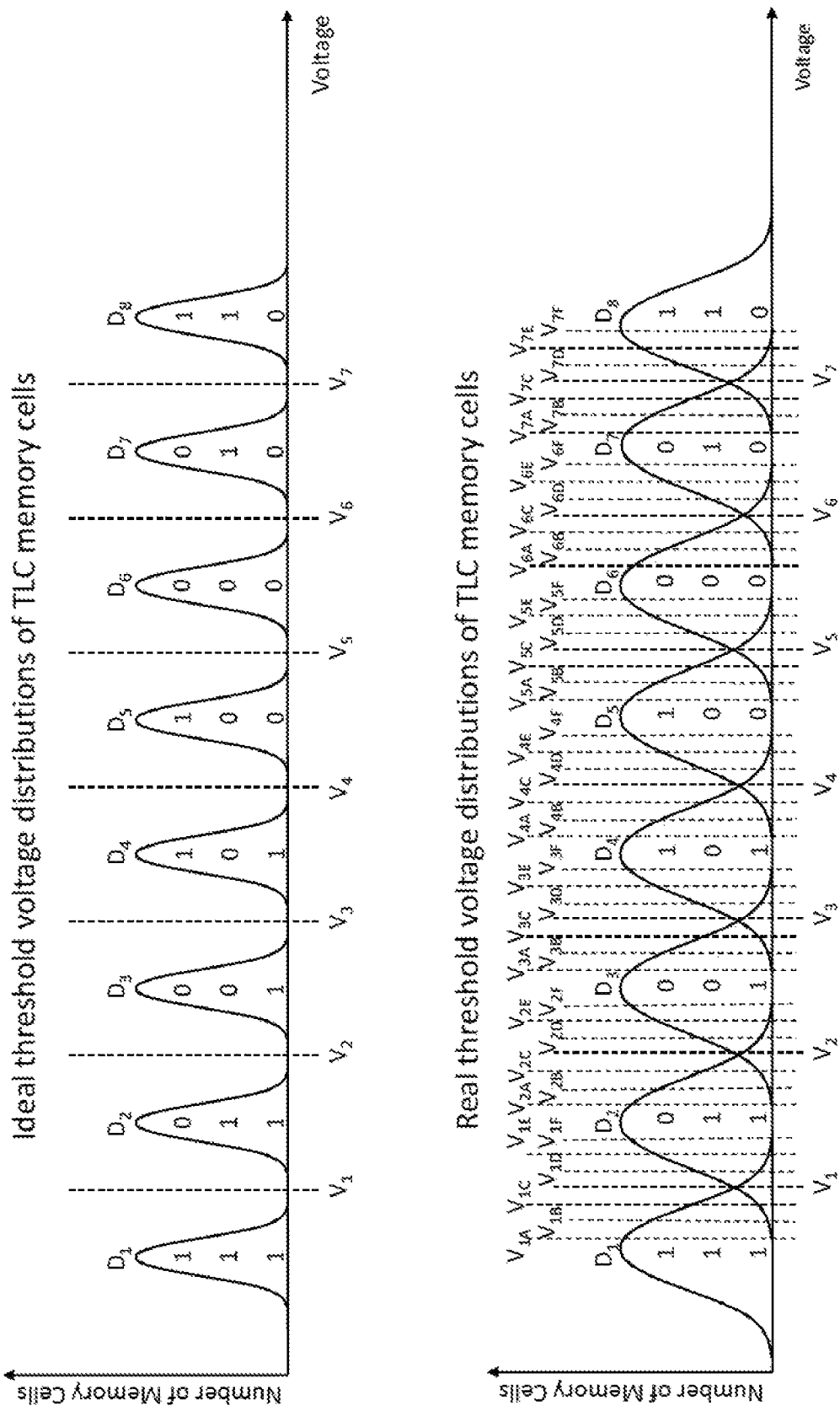

EFFICIENT ENCODING FOR NON-BINARY ERROR CORRECTION CODES

BACKGROUND OF THE INVENTION

Field of the Invention

Figure 1A:
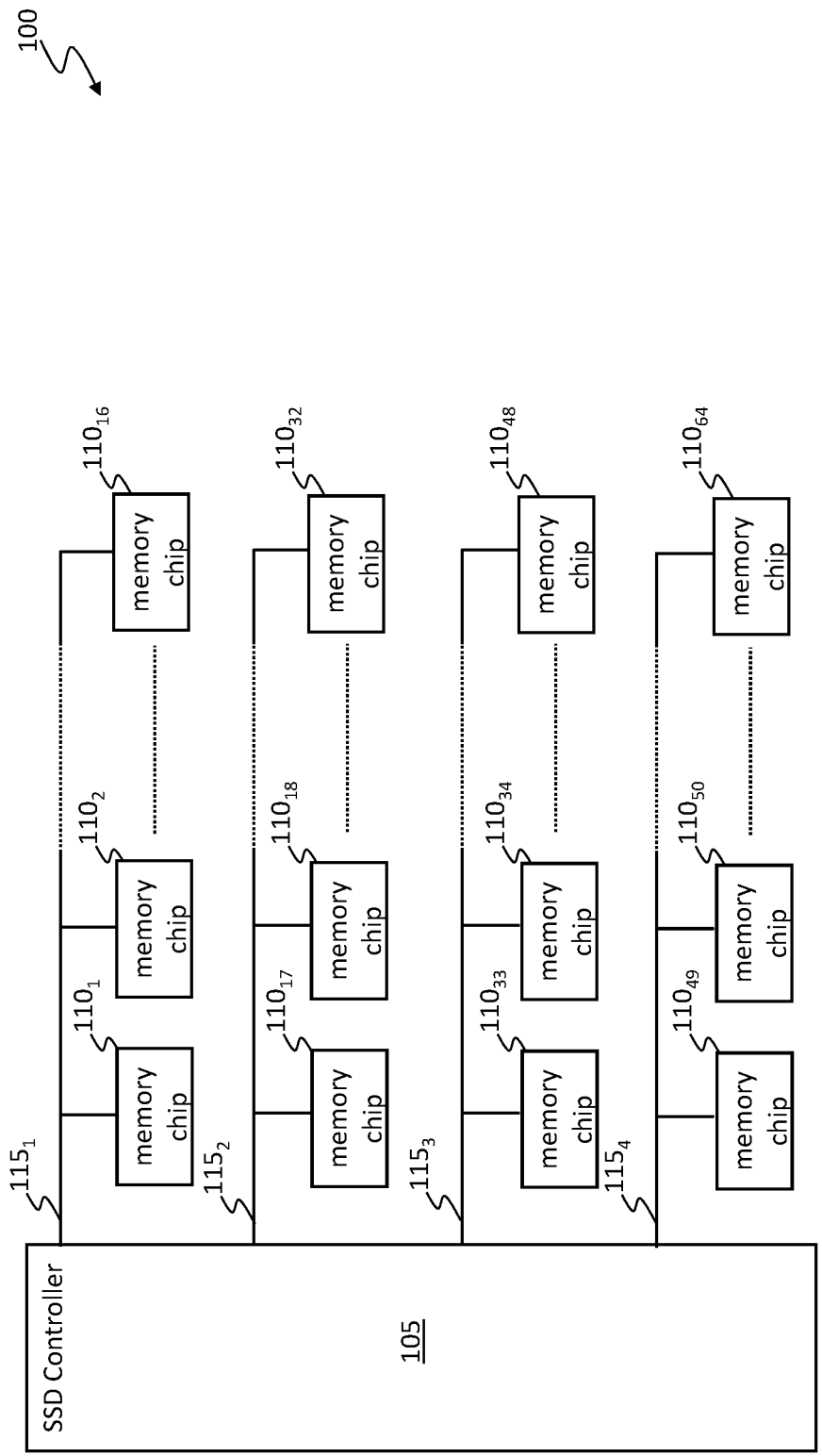

The present invention generally relates to solid state storage devices, also known as "Solid State Drives" (hereinafter, SSD devices), such as SSD devices provided with non-volatile memory chips (e.g., NAND flash memory chips) for storing data. More particularly, the present invention relates to SSD devices provided with error correction capabilities. Even more particularly, the present invention relates to a SSD device implementing (e.g., in a controller thereof) efficient bit encoding with a non-binary "Error Correction Code" (ECC code), such as a non-binary (or Q-ary) LDPC code.

Overview of the Related Art

SSD devices are nowadays widely used, for example as storage units of computers in replacement of HDD ("Hard Disk Drives").

A common SSD device comprises non-volatile memory chips (for example, NAND flash memory chips) each one including non-volatile memory cells for storing data (bits) even in the absence of external power supply, and a SSD device controller (hereinafter, SSD controller) for managing SSD device operations, such as write/program, erase and read operations.

A common type of memory cell comprises a floating gate transistor: each bit or group of bits (identifying a respective logical state of the memory cell) is physically stored in each memory cell in the form of electric charge in the floating gate, which defines a corresponding threshold voltage of the transistor. The number of bits each memory cell is capable of storing depends on memory cell technology. For example, in "Single-Level Cell" (SLC) technology each memory cell (or SLC memory cell) is capable of storing one symbol (or bit pattern) comprising one bit (i.e. two logical states, 0 or 1, defining two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining eight threshold voltages).

While, ideally, all memory cells in a memory chip should feature same (nominal) threshold voltages for same logical states (or, equivalently, for same symbols or bit patterns), practically each threshold voltage associated with a corresponding logical state (or, equivalently, with a corresponding symbol or bit pattern) differs across the memory cells and defines a respective threshold voltage distribution (typically, a Gaussian-type probability distribution), thus resulting in a number of threshold voltage distributions equal to the possible logical states each memory cell can take.

Ideally, the threshold voltage distributions are spaced apart from one another, and a corresponding reference voltage is set between each pair of adjacent threshold voltage distributions for sensing/reading the logical state of the memory cells. This is schematically shown in the top drawing of FIG. 2B for a 2-bit MLC memory cell (hereinafter referred to as MLC memory cell for the sake of conciseness) and in the top drawing of FIG. 2C for a TLC memory cell. In such figures the threshold voltage distributions are denoted by $D_j$ (j ranging from 1 to 4 for the MLC memory cell, and from 1 to 8 for the TLC memory cell).

Figure 2A:
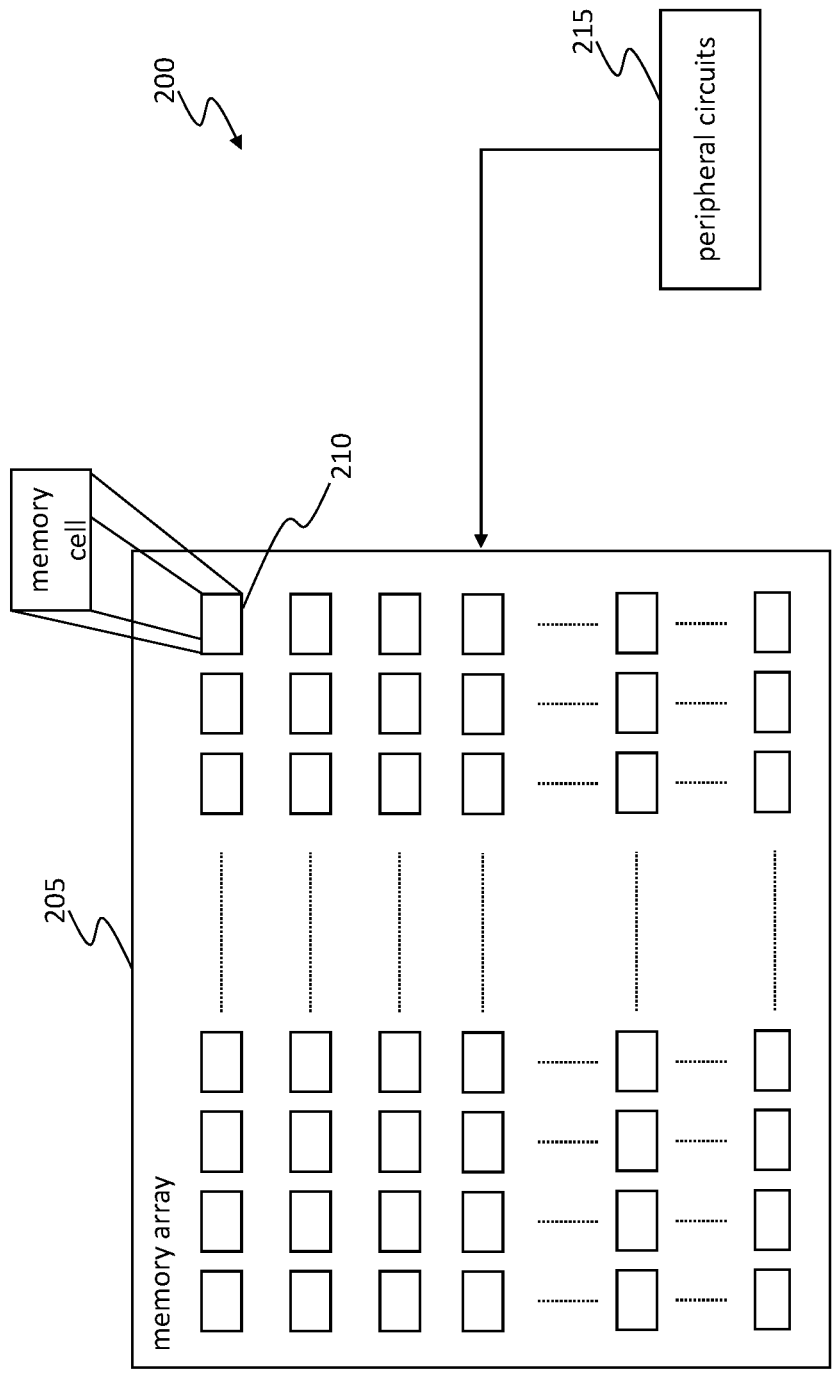
Figure 2B:
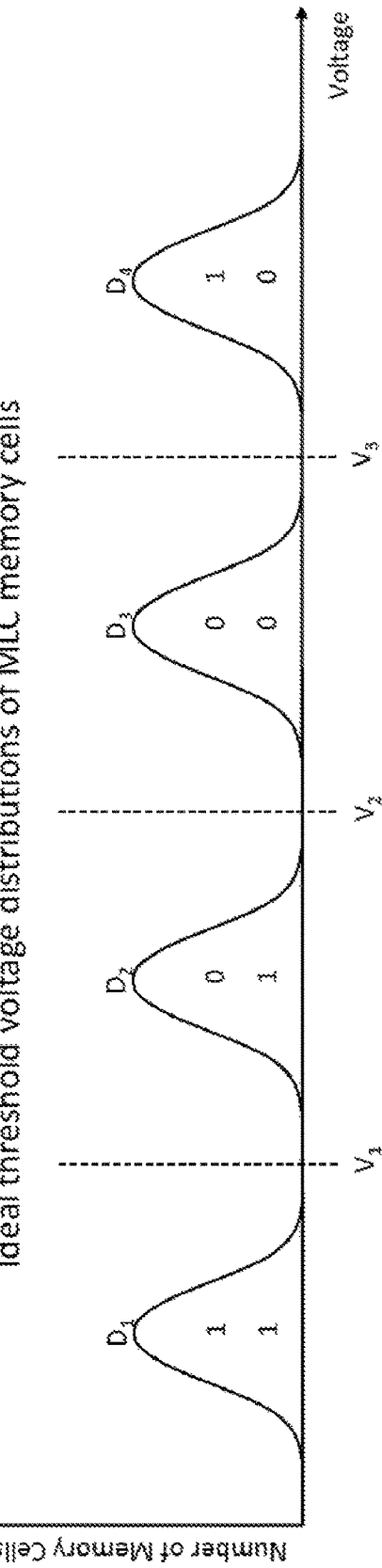
Figure 2B:
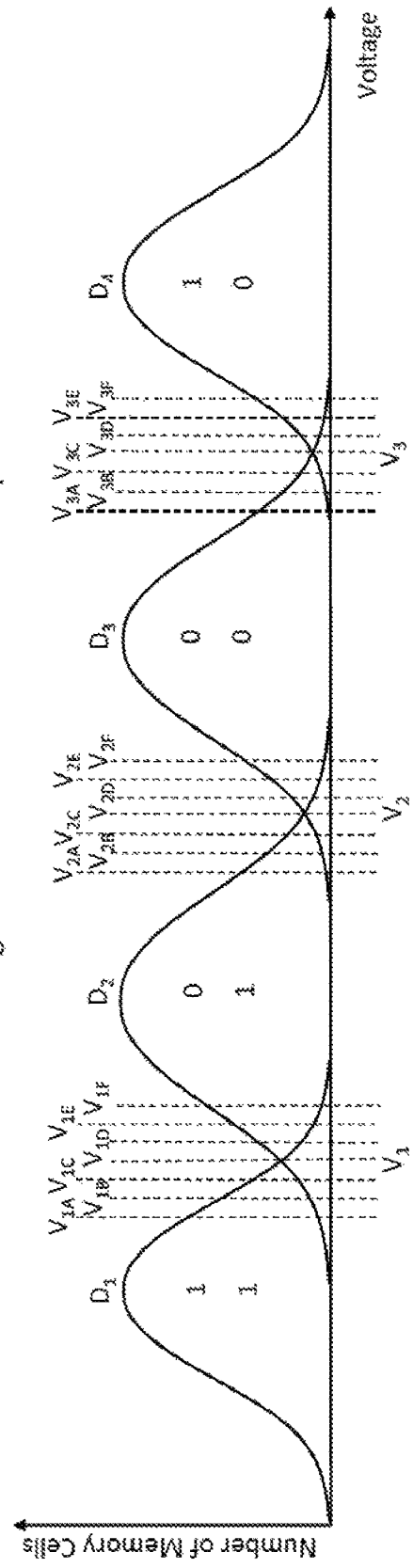

The threshold voltage distributions $D_j$ are (ideally) spaced apart from one another, and a corresponding reference voltage $V_k$ (usually referred to as hard reference voltage) is set between each pair of adjacent threshold voltage distributions $D_j$ for sensing/reading the logical state of the memory cells (k=1, 2, 3 in the example of FIG. 2B and k=1, 2, 3, 4, 5, 6, 7 in the example of FIG. 2C).

In case of the MLC memory cell, during a read operation a threshold voltage below the hard reference voltage $V_1$ represents the symbol "11", a threshold voltage between the hard reference voltages $V_1$ and $V_2$ represents the symbol "01", a threshold voltage between the hard reference voltages $V_2$ and $V_3$ represents the symbol "00", and a threshold voltage above the hard reference voltage $V_3$ represents the symbol "10".

In case of the TLC memory cell and in the exemplary considered coding distributions, during a read operation, a threshold voltage below the hard reference voltage $V_1$ represents the symbol "111", a threshold voltage between the hard reference voltages $V_1$ and $V_2$ represents the symbol "011", a threshold voltage between the hard reference voltages $V_2$ and $V_3$ represents the symbol "001", a threshold voltage between the hard reference voltages $V_3$ and $V_4$ represents the symbol "101", a threshold voltage between the hard reference voltages $V_4$ and $V_5$ represents the symbol "100", a threshold voltage between the hard reference voltages $V_5$ and $V_6$ represents the symbol "000", a threshold voltage between the hard reference voltages $V_6$ and $V_7$ represents the symbol "010", and a threshold voltage above the hard reference voltage $V_7$ represents the symbol "110".

To read a memory cell, the threshold voltage of the memory cell is compared to the hard reference voltages $V_k$. Typically, reading a memory cell that stores a symbol of m bits may require, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

However, the increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference and retention, which translates into partially overlapping areas of adjacent threshold voltage distributions $D_j$ (shown in the bottom drawings of FIGS. 2B and 2C) and, hence, into the increasing of the number of bit errors.

In order to compensate for larger bit errors, and to increase SSD device reliability, "Forward Error Correction" has been proposed (and typically implemented in the SSD controller) for locating and correcting bit errors. According to "Forward Error Correction" principles, the bits to be stored are encoded in a redundant way (e.g., by adding parity bits) by means of an "Error Correction Code" (ECC code), so that redundancy allows detecting a limited number of bit errors that may occur anywhere in the read bits, and to correct these errors without rereading. Generally, the number of detectable and correctable bit errors increases as the number of parity bits in the ECC code increases.

The probability of corrupted read bits, which therefore contains incorrect bits, before correction is referred to as "Raw Bit Error Rate" (RBER). The RBER is typically estimated (e.g., by the SSD controller) according to a shape of the threshold voltage distributions $D_j$, and particularly according to the overlapping areas of the adjacent threshold voltage distributions $D_j$.

As a result of the advances in memory cell technology, the RBER for selected memory cells is increasing. The RBER observed after application of the ECC code is referred to as "Frame Bit Error Rate" (FER), whereas the FER divided by the number of read bits is referred to as "Uncorrectable Bit Error Rate" (UBER).

The acceptable UBER is often dependent upon the application in which the SSD device is intended to be employed. In the case of price sensitive, consumer applications, which experience a relatively low number of accesses (e.g., program/erase cycles), the SSD device may tolerate a higher UBER as compared to a high-end application experiencing a relatively high number of accesses, such as an enterprise application.

To achieve an acceptable UBER, especially for enterprise applications, ECC codes such as "Low-Density Parity-Check" (LDPC) codes have been widely used (both alone and in combination with other ECC codes), which allow determining each bit value by means of hard bits (i.e., the read bits resulting from comparisons to the hard reference voltages $V_k$) and of additional information including soft bits and an indication of the reliability of each read (hard and soft) bit typically evaluated according to RBER.

As far as LDPC codes are concerned, binary LDPC codes and non-binary LDPC codes are known.

SUMMARY OF THE INVENTION

Non-binary LDPC codes are known to outperform binary codes of comparative length over many types of channels, and thus represent better candidates than binary LDPC codes in terms of decoding capability.

In the state of the art, the parity-check matrix defining the LDPC code is typically quasi-cyclic matrix rather than a systematic matrix. If, on the one hand, a quasi-cyclic matrix can be stored in the SSD device more conveniently than a systematic matrix, on the other hand performing matrix inversion of the quasi-cyclic matrix to determine the corresponding generator matrix (i.e., the matrix providing encoded bits from information bits) proves to be difficult and too computationally expensive.

According to the Applicant, the conventional approaches to handle it are not satisfactory.

A first approach provides for physically storing in the SSD device the generator matrix corresponding to the parity-check matrix. However, this would affect the rate-compatible structure underlying the construction, and in particular no change to the parity-check matrix can be performed (e.g., for changing the code rate of the LDPC code, i.e. the proportion of useful, non-redundant data-stream).

A second approach provides for implementing an algorithm to derive the parity-check matrix from the generator matrix. However, even assuming it is feasible, it would be too expensive in terms of hardware complexity, therefore impairing the "Quality of Service".

The Applicant has tackled the above-discussed issues, and has devised a solution for efficiently encoding bits with non-binary ECC codes, such as non-binary LDPC codes.

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect thereof).

More specifically, an aspect of the present invention relates to a method for encoding, in a solid state storage device, information bits with a Q-ary linear error correction code defined over a binary-extension Galois field $GF(2^k)$. The Q-ary linear error correction code is preferably defined by a quasi-cyclic parity-check matrix preferably having an information section associated with the information bits and a parity section associated with parity bits. The parity section preferably has an approximate lower triangular form and preferably comprises a plurality of circulants. The parity section preferably comprises:

a first circulant sub-matrix comprising a first circulant having a first shift and being defined by a first parameter belonging to the Galois field $GF(2^k)$;

a second circulant sub-matrix having a triangular structure and comprising a second circulant having a second shift and being defined by a second parameter belonging to the Galois field $GF(2^k)$, said second parameter being the inverse of the first parameter, the second shift being equal to a difference between a number of rows of each circulant and the first shift;

a third circulant sub-matrix comprising a third circulant having a third shift and being defined by a third parameter belonging to the Galois field $GF(2^k)$;

and a fourth circulant sub-matrix, wherein the method comprises:

determining a first set of parity-check bits according to the information bits, to said second and third circulant sub-matrices, and to a fourth circulant, the fourth circulant having a fourth shift and being defined by the multiplicative inverse of a fourth parameter given by a product between the first and third parameters, wherein the fourth shift is equal to a difference between said number of rows and said first and third shifts, and determining a second set of parity-check bits according to the determined first set of parity-check bits, to said first and second circulant sub-matrices and to the information bits.

According to an embodiment, the information section of the parity-check matrix comprises a fifth and a sixth circulant sub-matrices; preferably, said determining a first set of parity-check bits is further performed according to said fifth and a sixth circulant sub-matrices.

According to an embodiment, said determining the first set of parity-check bits comprises determining the first set of parity-check bits according to an amount given by:

the sum between the fifth circulant sub-matrix, the sixth circulant sub-matrix, and the third circulant sub-matrix multiplied by the inverse of the second circulant sub-matrix.

According to an embodiment, the method further comprises:

periodically and/or aperiodically updating the fifth and sixth circulant sub-matrices and said amount according to the updated fifth and sixth circulant sub-matrices, and determining the first set of parity-check bits according to said updated amount.

According to an embodiment, the information section of the parity-check matrix comprises a fifth circulant sub-matrix; preferably, said determining a second set of parity-check bits is further performed according to said fifth circulant sub-matrix.

According to an embodiment, the Q-ary linear error correction code is a Q-ary "Low-Density Parity-Check" (LDPC) code.

Another aspect of the present invention relates a controller for a solid state storage device. The controller is configured for encoding information bits with a Q-ary linear error correction code defined over a binary-extension Galois field $GF(2^k)$, wherein the Q-ary linear error correction code is defined by a quasi-cyclic parity-check matrix having an information section associated with the information bits and a parity section associated with parity bits. The parity section preferably has an approximate lower triangular form and preferably comprises a plurality of circulants. The parity section preferably comprises:

a first circulant sub-matrix comprising a first circulant having a first shift and being defined by a first parameter belonging to the Galois field $GF(2^k)$;

a second circulant sub-matrix having a triangular structure and comprising a second circulant having a second shift and being defined by a second parameter belonging to the Galois field $GF(2^k)$, said second parameter being the inverse of the first parameter, the second shift being equal to a difference between a number of rows of each circulant and the first shift;

a third circulant sub-matrix comprising a third circulant having a third shift and being defined by a third parameter belonging to the Galois field $GF(2^k)$; and a fourth circulant sub-matrix, The controller is preferably configured to:

determine a first set of parity-check bits according to the information bits, to said second and third circulant sub-matrices, and to a fourth circulant, the fourth circulant having a fourth shift and being defined by the multiplicative inverse of a fourth parameter given by a product between the first and third parameters, wherein the fourth shift is equal to a difference between said number of rows and said first and third shifts, determine a second set of parity-check bits according to the determined first set of parity-check bits, to said first and second circulant sub-matrices and to the information bits, and store the information bits and the first and second sets of parity-check bits in memory cells of the solid state storage device.

According to an embodiment, the information section of the parity-check matrix comprises a fifth and a sixth circulant sub-matrices; preferably, the controller is configured to determine said first set of parity-check bits further according to said fifth and a sixth circulant sub-matrices.

According to an embodiment, the controller is configured to determine the first set of parity-check bits according to an amount given by:

the sum between the fifth circulant sub-matrix, the sixth circulant sub-matrix, and the third circulant sub-matrix multiplied by the inverse of the second circulant sub-matrix.

According to an embodiment, the controller is further configured to:

periodically and/or aperiodically update the fifth and sixth circulant sub-matrices and said amount according to the updated fifth and sixth circulant sub-matrices, and determine the first set of parity-check bits according to said updated amount.

According to an embodiment, the information section of the parity-check matrix comprises a fifth circulant sub-matrix; preferably, the controller is configured to determine said second set of parity-check bits further according to said fifth circulant sub-matrix.

According to an embodiment, the Q-ary linear error correction code is a Q-ary "Low-Density Parity-Check" (LDPC) code.

A further aspect of the present invention relates to a solid state storage device (such as a flash memory device) comprising memory cells (such as flash memory cells) and the controller of above.

BRIEF DESCRIPTION OF THE ANNEXED DRAWINGS

Figure 1B:
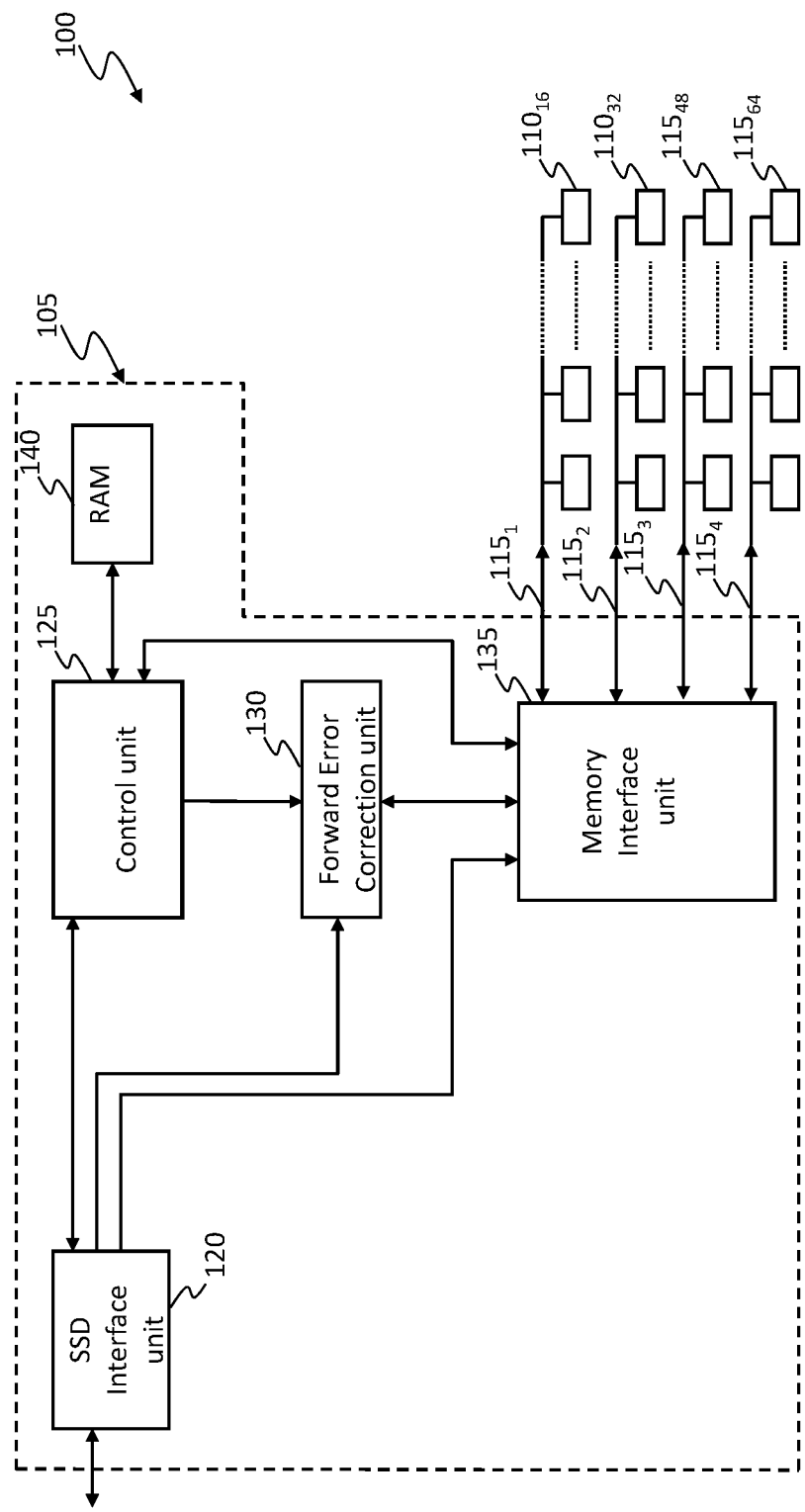
Figure 3:
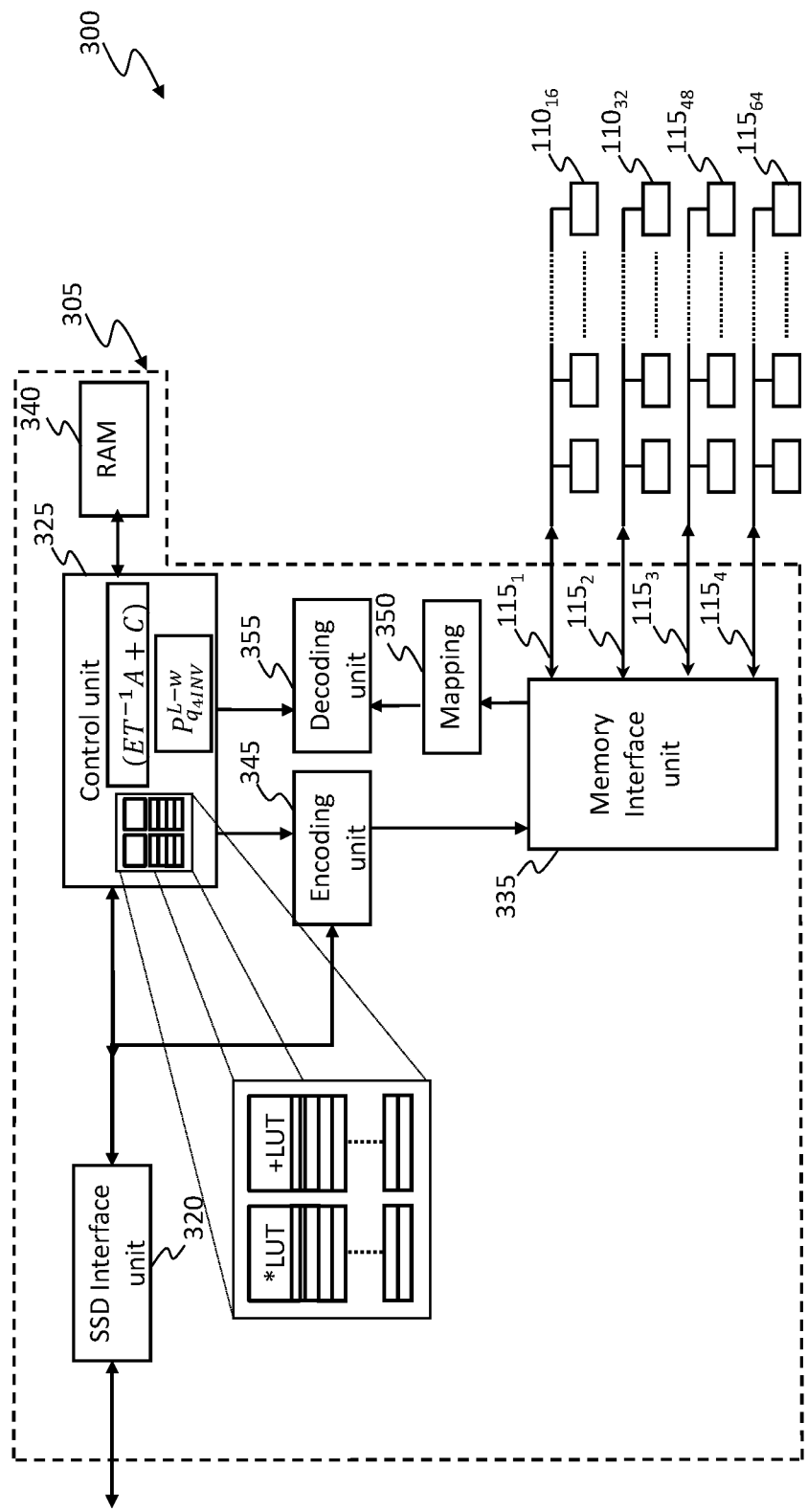
Figure 4:
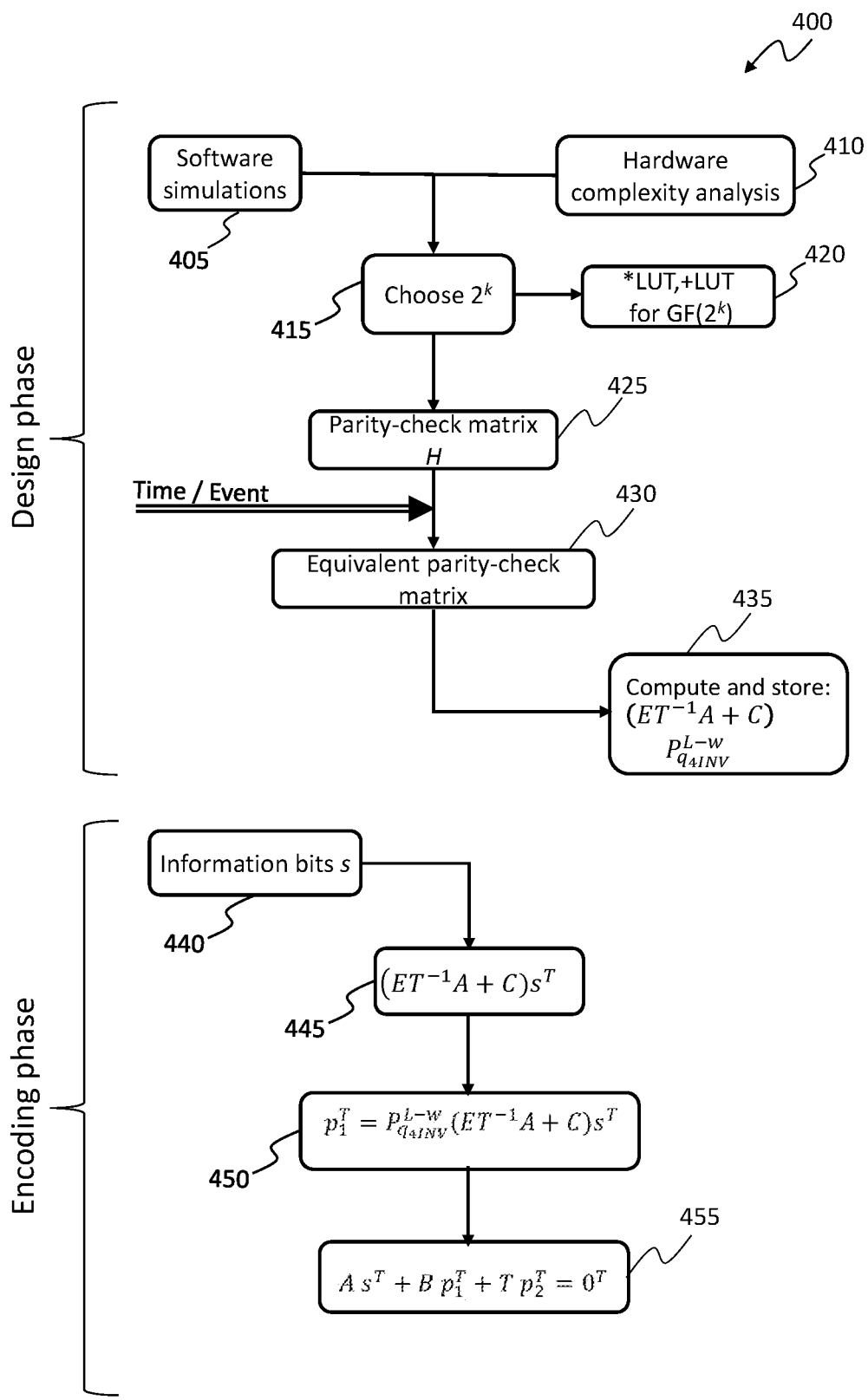

These and other features and advantages of the present invention will be made apparent by the following description of some exemplary and non-limitative embodiments thereof. For its better intelligibility, the following description should be read making reference to the attached drawings, wherein:

FIG. 1A schematically shows a simplified architecture of a SSD device known in the state of the art;

FIG. 1B schematically shows a simplified architecture of a typical SSD controller of said SSD device;

FIG. 2A schematically shows a simplified architecture of a typical flash memory die of said SSD device;

FIG. 2B schematically shows exemplary ideal (top drawing) and real (bottom drawing) threshold voltage distributions of MLC memory cells of said flash memory die;

FIG. 2C schematically shows exemplary ideal (top drawing) and real (bottom drawing) threshold voltage distributions of TLC memory cells of said flash memory die;

FIG. 3 schematically shows a simplified architecture of a SSD controller according to the present invention;

FIG. 4 schematically shows an activity diagram of design (top drawing) and encoding (bottom drawing) phases of a procedure according to an embodiment of the present invention.

DETAILED DESCRIPTION OF PREFERRED EMBODIMENTS OF THE INVENTION

With reference to the drawings, FIG. 1A schematically shows a simplified architecture of a "Solid State Drive" device (SSD device) 100 known in the state of the art.

The SSD device 100 preferably comprises a controller (e.g., a processor and/or other control circuitry, referred to herein as SSD controller) 105, a plurality of non-volatile memory chips (e.g. flash memory chips, such as NAND flash memory chips) $110_i$ for storing bits even in the absence of external power supply (i=1, 2, 3, ..., I, with I=64 in the example at issue), and a plurality of (e.g., synchronous and/or asynchronous) channels $115_j$ (j=1, 2, 3, ..., J, with J=4 in the example at issue) communicably coupling the SSD controller 105 and the memory chips $110_i$ to each other—in the exemplary illustration, each channel $115_j$ communicably couples the SSD controller 105 to a set of 16 memory chips $110_i$ (e.g., with the channels $115_1$, $115_2$, $115_3$ and $115_4$ that communicably couple the SSD controller 105 to the memory chips $110_1$-$110_{16}$, $110_{17}$-$110_{32}$, $110_{33}$-$110_{48}$ and $110_{49}$-$110_{64}$, respectively).

With reference also to FIG. 1B, it schematically shows, in terms of operating units, a simplified architecture of a typical SSD controller 105—the term "unit" being herein intended to emphasize functional (rather than implementation) aspects thereof (each unit including, for example, hardware or circuitry with processing and/or storing capabilities). For the sake of completeness, such a figure also shows, with a smaller size, the memory chips $110_i$ and the channels $115_j$ (only some of the memory chips being numbered in such a figure for ease of illustration).

The SSD controller 105 comprises a SSD interface unit 120 allowing data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 120. The SSD interface unit 120 may be in the form of a standardized interface. For example, when the SSD device 100 is used for data storage in a computing system, the SSD interface unit 120 can be a "Serial advanced technology attachment" (SATA), a "Peripheral Component Interconnect express" (PCIe), or a "Universal Serial Bus" (USB).

Data exchanged between the SSD device 100 (through the SSD interface unit 120 of the SSD controller 105) and the host may comprise, but are not limited to, information bits to be stored (i.e., the information bits to be written in the memory chips $110_i$), read information bits (i.e., the information bits stored in, and read from, the memory chips $110_i$), user commands indicative of the operations to be performed by the SSD controller 105 on the memory chips $110_i$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by bi-directional arrow connections between the units.

The SSD controller 105 also comprises a control unit 125 (or more thereof) for managing SSD device 100 operation, such as for receiving and processing the user commands from the SSD interface unit 120, handling bit transport to and from the memory chips $110_i$ along the channels $115_j$ and bit transport to and from the SSD interface unit 120, and coordinating enabling and/or disabling of the memory chips $110_i$ according to the user commands.

In order to compensate for large "Raw Bit Error Rate" (RBER), and to increase reliability of the SSD device 100, the SSD controller 105 also comprises a "Forward Error Correction" (FEC) unit 130 for locating and correcting bit errors. According to "Forward Error Correction" principles, the information bits to be stored in the memory chips $110_i$ (and provided either by the control unit 125 or, directly, from the SSD interface unit 105) are encoded in a redundant way (e.g., by adding parity bits) by means of an "Error Correction Code" (ECC code), so that redundancy allows detecting a limited number of bit errors that may occur anywhere in the read bits, and to correct these errors, during decoding, without rereading. The FEC unit 130 may comprise discrete components—such as an "Application Specific Integrated Circuit" (ASIC)—external to the control unit 125 (as herein assumed by way of example only), or the FEC unit 130 may reflect functionalities that do not necessarily have a discrete physical form separate from the control unit 125.

In order to ease bit transport between the SSD controller 105 and the memory chips $110_i$ along the respective channels $115_j$, the SSD controller 105 comprises one (as herein exemplary illustrated) or more memory interface units 135—alternatively, a memory interface unit 135 for each channel $115_j$ may be provided, or a memory interface unit 135 for each memory chip $110_i$, or for each group of memory chips $110_i$ may be provided.

As conceptually depicted in the figure by (unidirectional or bi-directional) arrow connections, which however should not be construed limitatively, the memory interface unit 135 is communicably coupled in a unidirectional manner to the SSD interface 120 (e.g., for receiving from it the information bits to be written when no ECC code is requested), and in a bi-directional manner to the control unit 125 (e.g., for receiving control information from it, such as an indication of the memory chips $110_i$ to be enabled for write or read operations, and for providing to it the read bits to be transmitted to the SSD interface unit 120) and to the FEC unit 130 (for example, for receiving encoded bits from it, e.g. including the information and parity bits, and for providing to it the read bits to be decoded before transmitting to the control unit 125, and hence to the SSD interface unit 120, the read information bits).

The SSD controller 105 further comprises a memory unit (e.g., a "Random Access Memory", RAM) 140 communicably coupled (in a bi-directional manner) to the control unit 125, e.g. for receiving and storing statistical information (such as number of program/erase cycles, and number of bit errors) and/or diagnostic information (such as working temperature, power consumption) retrieved and/or calculated by the control unit 125 (e.g. based on SSD device 100 operation and/or on sensors and/or diagnostic circuits within the SSD device 100, not shown), and, when required, for feeding the control unit 125 with the stored information.

A typical flash memory chip $110_i$ may comprise one or more flash memory dice.

A typical flash memory die, illustrated in FIG. 2A and denoted by the number reference 200, comprises one (as depicted) or more memory arrays 205 of memory cells (e.g., NAND flash memory cells) 210 arranged in rows and columns. Each memory array 205 is typically divided into multiple memory pages. Broadly speaking, each memory page comprises a number of memory cells 210 that can be programmed and read simultaneously. A number of memory pages form a memory block, and the size of the memory block equals to the product of the size of the memory page and the total number of memory pages in the memory block.

Each memory cell 210 is programmable to store a bit or group of bits (or bit pattern) among a plurality of bit patterns, wherein each bit pattern identifies or is associated with a respective logical state of the memory cell 210. Each memory cell 210 preferably comprises a floating gate transistor (not illustrated). Each bit pattern identifying a respective logical state of the memory cell 210 is physically stored in each memory cell 210 in the form of electric charge in the floating gate, which defines a corresponding threshold voltage of the transistor. The number of bits each memory cell 210 is capable of storing depends on memory cell technology. For example, in "Single-Level Cell" (SLC) technology each memory cell (or SLC memory cell) is capable of storing one bit pattern comprising one bit (i.e. two logical states, 0 or 1, defining, i.e. being associated with, two threshold voltages), in "Multi-Level Cell" (MLC) technology each memory cell (or MLC memory cell) is capable of storing one bit pattern comprising more than one bit, typically two bits (i.e. four logical states, 00, 01, 10, or 11, defining, i.e. being associated with, four threshold voltages), whereas in "Tri-Level Cell" technology each memory cell (or TLC memory cell) is capable of storing one bit pattern comprising three bits (i.e. eight logical states, 000, 001, 010, 011, 100, 101, 110 or 111, defining, i.e. being associated with, eight threshold voltages).

While, ideally, all memory cells 210 in the flash memory die 200 should feature and be associated with same (nominal) threshold voltages for same logical states (or, equivalently, for same bit patterns), practically each threshold voltage associated with a corresponding logical state (or, equivalently, associated with a corresponding bit pattern) differs across the memory cells 210 and defines a respective threshold voltage distribution $D_j$ (typically, a Gaussian-type probability distribution), thus resulting in a number of threshold voltage distributions $D_j$ equal to the possible logical states each memory cell 210 can take; otherwise stated, memory cells programmed to store a same bit pattern among the plurality of bit patterns exhibit actual threshold voltages that are variable over the memory cells 210 around the corresponding nominal threshold voltage thereby defining a respective threshold voltage distribution $D_j$ associated with that same bit pattern. This is schematically shown in the top drawing of FIG. 2B for a MLC memory cell and in the top drawing of FIG. 2C for a TLC memory cell.

The threshold voltage distributions $D_j$ are (ideally) spaced apart from one another, and a corresponding hard reference voltage $V_k$ is set between each pair of adjacent threshold voltage distributions $D_j$ for sensing/reading the logical state of the memory cells 210 (k=1, 2, 3 in the example of FIG. 2B and k=1, 2, 3, 4, 5, 6, 7 in the example of FIG. 2C). Therefore, each pair of adjacent bit patterns, which are associated with a corresponding adjacent pair of nominal threshold voltages (and hence with a corresponding adjacent pair of threshold voltage distributions $D_j$), can be discriminated, during a read operation, by a respective hard reference voltage $V_k$ which is between the corresponding adjacent nominal threshold voltages.

In the case of SLC memory cell (k=1), during a read operation a threshold voltage below the hard reference voltage $V_1$ represents the symbol "1", and a threshold voltage above the hard reference voltage $V_1$ represents the symbol "0".

In the case of MLC memory cell, during a read operation, a threshold voltage below the hard reference voltage $V_1$ represents the symbol "11", a threshold voltage between the hard reference voltages $V_1$ and $V_2$ represents the symbol "01", a threshold voltage between the hard reference voltages $V_2$ and $V_3$ represents the symbol "00", and a threshold voltage above the hard reference voltage $V_3$ represents the symbol "10".

In the case of TLC memory cell and in the exemplary considered coding distributions, during a read operation, a threshold voltage below the hard reference voltage $V_1$ represents the symbol "111", a threshold voltage between the hard reference voltages $V_1$ and $V_2$ represents the symbol "011", a threshold voltage between the hard reference voltages $V_2$ and $V_3$ represents the symbol "001", a threshold voltage between the hard reference voltages $V_3$ and $V_4$ represents the symbol "101", a threshold voltage between the hard reference voltages $V_4$ and $V_5$ represents the symbol "100", a threshold voltage between the hard reference voltages $V_5$ and $V_6$ represents the symbol "000", a threshold voltage between the hard reference voltages $V_6$ and $V_7$ represents the symbol "010", and a threshold voltage above the hard reference voltage $V_7$ represents the symbol "110".

To read a memory cell 210, the threshold voltage of the memory cell 210 is compared to the hard reference voltages $V_k$. According to an embodiment, reading a memory cell 210 that stores a bit pattern of m bits requires, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

Back to FIG. 2A, the memory die 200 preferably comprises peripheral circuits (such as decoders, multiplexers, drivers, buffers, sense amplifiers), which, being not relevant for the present description, are represented in the figure by means of a single functional block (denoted by the number reference 215). Such peripheral circuits 215 are configured, in general, for accessing selected (pages of) memory cells (as conceptually represented in the figure by arrow connection between the peripheral circuits 215 and the memory array 205) and for running selected operations thereon (e.g. write, read, diagnosis operations).

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference, mainly arising from floating gate coupling effect between a target memory cell (i.e., a memory cell to be read or written) and the surrounding memory cells, and retention, i.e. a loss of the capability of the memory cells to retain the stored bits over time caused by progressive damage of the oxide layer (due to the high electrical fields applied at each program/erase operation) that determines an undesired flow of electrons away/in the floating gate.

Cell-to-cell interference and retention translate into partially overlapping areas of adjacent threshold voltage distributions $D_j$ (shown in the bottom drawings of FIGS. 2B and 2C) and, hence, into increasing of the probability of the number of bit errors per unit time (i.e., the RBER).

With reference now to FIG. 3, it schematically shows, in terms of operating units, a simplified architecture of a SSD controller 305 according an embodiment the present invention. For the sake of completeness, such a figure also shows, in a smaller size, the memory chips $110_i$ and the channels $115_j$ (equivalent to those illustrated in the previous figures), which identify, together with the SSD controller 305, a SSD device 300. Similarly to the above, the term "unit" is herein intended to emphasize functional (rather than implementation) aspects thereof. Indeed, without losing of generality, each unit of the SSD controller 305 may be physically implemented by software, hardware, and/or a combination thereof, and/or within any pre-existing or dedicated entity. In this respect, the operating units may also be intended to represent corresponding method steps of a method according to the present invention.

As visible in the figure, the SSD controller 305 comprises, similarly to the SSD controller 105, a SSD interface 320, a control unit 325, a memory interface unit 335, and a memory unit 340, which will not be discussed again for the sake of conciseness.

The SSD controller 305 also comprises an encoding unit 345 for encoding the bits to be stored in the memory array 205 (i.e., the information bits) by means of an ECC code. According to an embodiment of the present invention, the encoding unit 345, and the respective decoding unit (discussed in the following), are implemented in the FEC unit 130.

Preferably, the ECC code is an ECC code allowing soft decoding—or, otherwise stated, an ECC code that allows determining each bit value by means of hard bits (i.e., the read bits resulting from comparisons to the hard reference voltages $V_k$) and of additional information including soft bits and an indication of the reliability of each read (hard and soft) bit typically evaluated or estimated according to RBER. More preferably, the ECC code is a "Low Density Parity-Check" (LDPC) code—hence, the encoding unit 345 will be referred to as LDPC encoding unit 345 and the corresponding encoded bits will be referred to as LDPC encoded bits. LDPC code is a linear ECC code (constructed by using a sparse bipartite graph) that allows transmitting data over a noisy channel. LDPC code is a capacity-approaching code, which means that practical constructions exist that allow the noise threshold to be set very close to the theoretical maximum (the Shannon limit given by the Shannon theorem) for a symmetric memory-less channel.

The Shannon theorem specifies the maximum rate at which data can be transmitted over a channel of a specified bandwidth in the presence of noise. More specifically, according to the Shannon theorem, a bound on the maximum amount of error-free data that can be transmitted with a specified bandwidth in the presence of the noise interference is set, assuming that the signal power is bounded, and that the Gaussian noise process is characterized by a known power or power spectral density. The noise threshold defines an upper bound for the channel noise, up to which the probability of data errors can be made as small as desired.

Thanks to soft decoding allowed by LDPC code, for a given code rate (the ratio between the information bits to the (LDPC, in the case at issue) encoding unit and the total number of bits created by the encoding unit, the total number of bits created by the encoding unit including the parity bits), LDPC code approaches the Shannon limit more than ECC codes typically used in prior art solutions (such as Bose-Chaudhuri-Hocquenghem (BCH) codes), which translates into area saving while maximizing the probability of accurately recovering the bits after a read operation.

According to the preferred embodiment herein considered, the LDPC code used to encode the bits to be stored in the memory array 205 is a non-binary LDPC code (i.e. a Q-ary LDPC code ($Q \neq 2$)) defined over a binary-extension Galois field $GF(2^k)$—from now on, whenever LDPC code is mentioned, it should be taken to mean the non-binary (i.e., Q-ary) LDPC code defined over a binary-extension Galois field $GF(2^k)$. A finite field or Galois field (GF) is a field that contains a finite number of elements: as with any field, a Galois field is a set on which the operations of multiplication, addition, subtraction and division are defined and satisfy certain basic rules.

Back to FIG. 3, the SSD controller 305 is configured to store the LDPC encoded bits in the memory chips $110_i$ (e.g., similarly to the above, by means of the memory interface unit 335 that transmits the LDPC encoded bits to the memory chips $110_i$, and thanks to control unit 325 action that controls addressing of the memory chips $110_i$ to be written/programmed). In the exemplary illustrated embodiment the LDPC encoded bits are fed directly to the memory interface unit 335, however this should not be construed limitatively: indeed, depending on the specific implementation, the LDPC encoded bits may be subject to additional processing before their storing in the memory chips $110_i$ (for example, each codeword of the LDPC code may be advantageously converted into a binary vector of length N*r, N being the length of the LDPC code).

For the sake of completeness, the SSD controller 305 also comprises a mapping unit 350 for "mapping" the read bits into N symbols, and a decoding unit 355 for decoding, e.g. based on a Q-ary Tanner graph of the Q-ary LDPC code, the N symbols in order to extract the information bits therefrom.

As mentioned in the introductory part of the present disclosure, non-binary LDPC codes represent better candidates than binary LDPC codes in terms of decoding capability, but the increase in encoding complexity is not negligible and has so far restricted their practical usage.

In fact, the parity-check matrix defining the Q-ary LDPC code is quasi-cyclic, whereby determining the corresponding generator matrix (to perform encoding) proves to be difficult and too computationally expensive as involving a matrix inversion. This would result in physically storing in the SSD device 300 the generator matrix corresponding to the parity-check matrix (which would prevent any changes to the parity-check matrix, e.g. for changing the code rate of the LDPC code due to noise variations caused by different stresses) or implementing an algorithm to derive the parity-check matrix from the generator matrix (which would be too expensive in terms of hardware complexity).

The present application relates to a solution for performing encoding of information bits with a Q-ary ECC code (such a Q-ary LDPC code) defined over a binary-extension Galois field $GF(2^k)$ in a fast way, without inverting the parity-check matrix or storing the generator matrix, while keeping a rate-compatible structure.

This solution takes advantage of the properties of the mathematical construction behind non-binary ECC codes, which will be illustrated here below.

Broadly speaking, based on the mathematical construction behind non-binary ECC codes, the Applicant has devised that, from the parity-check matrix that defines the Q-ary ECC code, operative data can be determined and stored in the control unit 325 (e.g. in proper memory locations thereof, as schematically depicted in FIG. 3) for encoding information bits with the Q-ary ECC code (such as the Q-ary, non-binary, LDPC code) in an efficient and fast way.

Let be considered the following quasi-cyclic parity-check matrix H defining the (quasi-cyclic) Q-ary LDPC code:

$$H = [H_I | H_P] = \begin{bmatrix} & & & & & \\ & P^x_{q_1} & I & 0 & \cdots & 0 \\ & & I & I & \cdots & 0 \\ & 0 & P^y_{q_2} & I & \cdots & 0 \\ H_I & 0 & 0 & 0 & \cdots & 0 \\ & \vdots & \vdots & \vdots & \ddots & \vdots \\ & 0 & 0 & 0 & \ddots & I \\ & P^x_{q_1} & P^z_{q_3} & 0 & \cdots & I \end{bmatrix}$$

wherein:
$H_I$ is the information part (or information section) of the parity-check matrix H, the information part being associated with the information bits;
$H_P$ is the parity part (or parity section) of the parity-check matrix H;
0 is the null circulant, i.e. the matrix made up of zeroes;
I is the identity circulant;

$P_{q_i}^x$, $P_{q_i}^y$, $P_{q_i}^z$ are circulants defined by the i-th parameters $q_i$ belonging to the Galois field $GF(2^k)$, and having shifts x,y,z (x,y,z=0, 1, ..., L−1, wherein L is the number of rows, or columns, of the circulant); in the example, at issue, $H_P$ contains four (nontrivial) circulants $P_{q_1}^x$, $P_{q_1}^x$, $P_{q_2}^y$, $P_{q_3}^z$ (two of which are the same) independently from the number of rows.

An equivalent parity-check matrix having an approximate lower triangular form is determined from the parity-check matrix H, as disclosed in T. J. Richardson; R. L. Urbanke, "*Efficient encoding of low-density parity-check codes*" (which is incorporated herein by reference).

According to T. J. Richardson; R. L. Urbanke, "*Efficient encoding of low-density parity-check codes*", the equivalent parity-check matrix is obtained by splitting the parity check matrix H into six circulant sub-matrices A, B, C, D, E, T:

$$H = [H_I | H_P] = \begin{bmatrix} H_I & \begin{array}{c|ccccc} P_{q_1}^x & I & 0 & \cdots & 0 \\ I & I & I & \cdots & 0 \\ 0 & P_{q_2}^y & I & \cdots & 0 \\ 0 & 0 & 0 & \cdots & 0 \\ \vdots & \vdots & \vdots & \ddots & \vdots \\ 0 & 0 & 0 & \ddots & I \\ \hline P_{q_1}^x & P_{q_3}^z & 0 & \cdots & I \end{array} \end{bmatrix} = \begin{bmatrix} A & B & T \\ C & D & E \end{bmatrix}$$

wherein:

$$B = \begin{bmatrix} P_{q_1}^x \\ I \\ 0 \\ 0 \\ \vdots \\ 0 \end{bmatrix}, D = [P_{q_1}^x],$$

$$T = \begin{bmatrix} I & 0 & \cdots & 0 \\ I & I & \cdots & 0 \\ P_{q_2}^y & I & \cdots & 0 \\ 0 & 0 & \cdots & 0 \\ \vdots & \vdots & \ddots & \vdots \\ 0 & 0 & \ddots & I \end{bmatrix}, E = [P_{q_3}^z \quad 0 \quad \cdots \quad I]$$

and by multiplying the parity-check matrix H from the left by $$\begin{bmatrix} I & 0 \\ ET^{-1} & I \end{bmatrix}$$

(T is a lower triangular matrix, so it can be easily inverted), thus obtaining:

$$\begin{bmatrix} A & B & T \\ ET^{-1}A + C & ET^{-1}B + D & ET^{-1}T + E \end{bmatrix}$$

and hence:

$$\begin{bmatrix} A & B & T \\ ET^{-1}A + C & ET^{-1}B + D & 0 \end{bmatrix}$$

since $ET^{-1}T=E$ and $E+E=0$ (in fact, doubling an element belonging to the Galois field $GF(2^k)$ always gives 0).

Considering the defining relationship for a codeword c:

$$H \cdot c^T = 0^T,$$

and let $c=(s, p_1, p_2)$, where s denotes the systematic or information bits of the codeword c, and $p_1$ and $p_2$ denote first and second sets of parity-check bits (to be used for encoding the information bits), respectively, then the above relationship results in the following linear equation system:

$$\begin{cases} As^T + Bp_1^T + Tp_2^T = 0^T \\ (ET^{-1}A + C)s^T + (ET^{-1}B + D)p_1^T = 0^T \end{cases}$$

whereby the first set of parity-check bits $p_1$ can be obtained from the second equation after inverting the amount $\varphi := ET^{-1}B+D$, and the second set of parity-check bits $p_2$ can be obtained from the first equation based on the information bits s and on the first set of parity-check bits $p_1$.

The Applicant has understood that, although the inversion of the amount $\varphi := ET^{-1}B+D$ for obtaining the first set of parity-check bits $p_1$ from the second equation is theoretically correct, such an inversion involves computational capabilities higher than those of the conventional SSD devices.

In order to solve such issue, the Applicant has devised a reformulation of the above-discussed equivalent parity-check matrix that makes determination of the first $p_1$ and second $p_2$ sets of parity-check bits (and, hence, the encoding of the information bits s) feasible in nowadays SSD devices.

Such a reformulation of the equivalent parity-check matrix starts from the ascertaining, by the Applicant, that the inverted circulant sub-matrix $T^{-1}$ has the following form (wherein the outlined area comprises a plurality of identity circulants):

$$T^{-1} = \begin{bmatrix} I & 0 & 0 & \cdots & 0 \\ I & I & 0 & \cdots & 0 \\ P_{q_2}^y + I & I & I & \cdots & 0 \\ \vdots & \vdots & \vdots & \ddots & \vdots \\ P_{q_2}^y + I & I & I & \cdots & I \end{bmatrix}$$

Therefore $$ET^{-1} = [P_{q_3}^z + P_{q_2}^y + I \ I \ \ldots \ I]$$

and $$ET^{-1}B + D = P_{q_3}^z P_{q_1}^x + P_{q_2}^y P_{q_1}^x + P_{q_1}^x + I + P_{q_1}^x = P_{q_3}^z P_{q_1}^x + P_{q_2}^y P_{q_1}^x + I.$$

The Applicant has also recognized that, in order to obtain a reformulation of the equivalent parity-check matrix that provides a simplification of the amount $\varphi := ET^{-1}B+D$, proper constraints on the parameter $q_2$ and on the shift y of the circulant $P_{q_2}^y$ may advantageously be set.

According to an embodiment of the present invention:
the parameter $q_2$ of the circulant $P_{q_2}^y$ is chosen, in a design phase of the LDPC code, as the inverse ($q_{1INV}$) of the parameter $q_1$ of the circulant $P_{q_1}^x$ in the Galois field $GF(2^k)$, i.e. such that $q_1 \cdot q_2 = 1$ in the Galois field $GF(2^k)$. In this way, the non-zero element of the circulant $P_{q_2}{}^y P_{q_1}{}^x = P_{q_{1INV}} {}^y P_{q_1}{}^x$ is 1.

the shift y of the circulant $P_{q_2}{}^y$ is chosen as y=L−x. Such a choice, which would be the same for the binary LDPC code, ensures that the main diagonal is full of values 1, thanks to the properties of exponents in the matrix product, whereby $P_{q_2}{}^y P_{q_1}{}^x = I$ and the amount $\varphi := ET^{-1}B + D$ is reduced to:

$$ET^{-1}B + D = P_{q_3}{}^z P_{q_1}{}^x$$

The parity-check matrix H and the linear equation system can therefore be written as follows:

$$H = [H_I | H_P] = \begin{bmatrix} H_I & \begin{matrix} P_{q_1}^x & I & 0 & \cdots & 0 \\ I & I & I & \cdots & 0 \\ 0 & P_{q_1INV}^{L-x} & I & \cdots & 0 \\ 0 & 0 & 0 & \cdots & 0 \\ \vdots & \vdots & \vdots & \ddots & \vdots \\ 0 & 0 & 0 & \ddots & I \\ P_{q_1}^x & P_{q_3}^z & 0 & \cdots & I \end{matrix} \end{bmatrix} = \begin{bmatrix} A & B & T \\ C & D & E \end{bmatrix}$$

$$\begin{cases} As^T + Bp_1^T + Tp_2^T = 0^T \\ (ET^{-1}A + C)s^T + (P_{q_3}^z P_{q_1}^x)p_1^T = 0^T \end{cases}$$

Since a Galois field of order $2^k$ is considered, the equation:

$$(ET^{-1}A + C)s^T + (P_{q_3}{}^z P_{q_1}{}^x)p_1^T = 0^T$$

can be written as:

$$(P_{q_3} P_{q_1}{}^x)p_1^T = (ET^{-1}A + C)s^T$$

and, more concisely:

$$P_{q_4}{}^w p_1^T = (ET^{-1}A + C)s^T$$

wherein:

w:=(x+z) is the shift resulting from the product between $P_{q_3}{}^z$ and $P_{q_1}{}^x$, and $q_4 := q_1 \cdot q_3$ is the parameter of the circulant $P_{q_4}{}^w$ (the equality being intended in the Galois field $GF(2^k)$).

Let the parameter $q_{4INV}$ be the multiplicative inverse of the parameter $q_4$, so that $q_4 \cdot q_{4INV} = 1$ in the Galois field $GF(2^k)$.

Multiplying both sides of the previous equation by the parameter $q_{4INV}$ results in:

$$q_{4INV} \cdot P_{q_4}{}^w p_1^T = q_{4INV} \cdot (ET^{-1}A + C)s^T$$

wherein the circulant $q_{4INV} \cdot P_{q_4}{}^w$, whose nonzero element is 1 by construction, describes a circular shift (as in the binary case). This means that by applying the opposite shift (which is equal to L−w) to both sides of the equation, the explicit expression of $p_1^T$ may be obtained:

$$p_1^T = P_{q_{4INV}}{}^{L-w}(ET^{-1}A + C)s^T$$

The more compact way of writing $P_{q_3}{}^z P_{q_1}{}^x$ avoids inverting the circulant product $P_{q_3}{}^z P_{q_1}{}^x$, thus obtaining a reformulation of the equivalent parity-check matrix that is feasible in nowadays SSD devices.

FIG. 4 schematically shows an activity diagram of a procedure 400 according to an embodiment of the present invention.

The procedure 400 preferably comprises two phases, namely a first phase (action nodes 405-435), or design phase, taking place at a design phase of the SSD device (and particularly, at a design phase of the Q-ary ECC code), and a second phase (action nodes 440-455), or encoding phase, taking place during operation of the SSD device 300 (i.e., at the SSD controller 305) and allowing information bits s (to be written in selected memory cells) to be encoded by means of the designed Q-ary ECC code.

During the design phase, based on software simulations (action node 405) and hardware complexity analysis (action node 410), the number of elements ($2^k$), or order or size, of the Galois field $GF(2^k)$ is chosen (action node 415). The higher the number of elements ($2^k$) of the Galois field $GF(2^k)$, the better the performances in terms of error correction. In any case, the higher the number of elements ($2^k$) of the Galois field $GF(2^k)$, the higher the increase in complexity (and, hence, in power consumption and latency). In view of this trade off, typical Galois fields $GF(2^k)$ that may be chosen based on current technology are $GF(2^8)$ and $GF(2^{16})$.

Then, look-up tables for multiplication and addition between the elements of the Galois field Galois field $GF(2^k)$ are preferably pre-computed and advantageously stored in proper memory locations of the SSD device 300 (action node 420).

As schematically depicted in FIG. 3, the look-up tables for multiplication (*LUT) and for addition (+LUT) may for example be stored in proper memory locations of the control unit 325.

In any case, at least the look-up table for addition may also be omitted in implementations of the present invention, with the addition of two elements in the Galois field $GF(2^k)$ that may for example be performed by any suitable technique.

Then, action node 425, the parity-check matrix H is determined and stored in a proper memory location of the SSD device 300, for example in a proper memory location of the control unit 325.

As discussed in connection with the above mathematical dissertation, the parity-check matrix H is determined at action node 425 by choosing the parameter $q_2$ of the circulant $P_{q_2}{}^y$ as the inverse of the parameter $q_1$ of the circulant $P_{q_1}{}^x$ in the Galois field $GF(2^k)$, (i.e. such that $q_1 \cdot q_2 = 1$ in the Galois field $GF(2^k)$), and by choosing the shift y of the circulant $P_{q_2}{}^y$ as y=L−x, whereby the above-discussed reformulation of the equivalent parity-check matrix devised by the Applicant is obtained (action node 430).

Based on the equivalent parity-check matrix H thus obtained, the amount $(ET^{-1}A+C)$ and the circulant $P_{q_{4INV}}{}^{L-w}$ are computed (advantageously, by exploiting the pre-computed look-up tables for multiplication *LUT and for addition +LUT), and stored in a proper memory location of the SSD device 300, for example, as schematically depicted in FIG. 3, in a proper memory location of the control unit 325—action node 435.

During the encoding phase, upon reception of the information bits s to be stored in the SSD device 300 (action node 440), the product $(ET^{-1}A+C)s^T$ is computed (action node 445) based on the stored amount $(ET^{-1}A+C)$ and on the received information bits s (advantageously, by exploiting the pre-computed look-up table for multiplication *LUT), and the first set of parity check bits $p_1$ is then determined (action node 450) by multiplying the resulting product $(ET^{-1}A+C)s^T$ by the stored circulant $P_{q_{4INV}}{}^{L-w}$ (advantageously, by exploiting the pre-computed look-up table for multiplication *LUT). According to a basic implementation, the first set of parity check bits $p_1$ may be determined by multiplying the stored circulant $P_{q_{4INV}}{}^{L-w}$ by a subset of the circulant sub-matrices, for example by the circulant sub-matrices E and T (or an inverse form thereof).

Then, action node 455, the second set of parity check bits $p_2$ may be determined by reversing the above-discussed equation $A\ s^T + B\ p_1^T + T\ p_2^T = 0^T$ and according to the information bits s and the just determined first set of parity check bits $p_1$. According to a basic implementation, the second set of parity check bits $p_2$ may be determined according to the information bits s, the just determined first set of parity check bits $p_1$, and to a subset of the circulant sub-matrices, for example the circulant sub-matrices B and T (or an inverse form thereof).

As mentioned above, it could be desired to change the parity-check matrix, for example to change the code rate of the LDPC code so as to take into account noise variations caused by different stresses. The parity-check matrix may for example be changed periodically (e.g., after a predetermined time period of use of the SSD device 300) and/or aperiodically (e.g., triggered by one or more events detected by the SSD device 300).

Parity-check matrix changes are typically performed by erasing one or more of the leftmost columns of the parity-check matrix. In doing so, only the circulant sub-matrices A and C of the equivalent parity-check matrix are affected.

In this case, according to a preferred embodiment of the present invention, the method 400 may also comprise updating, periodically and/or aperiodically (as conceptually illustrated by the double arrow "Time/Event" in the figure), the circulant sub-matrices A and C (and, hence, the equivalent parity-check matrix—action block 425) and updating and storing in the control unit 325 the amount $(ET^{-1}A+C)$—action block 435—to be for the subsequent encoding phase (action blocks 445 and 450).

Preferably, although not illustrated, the periodical and/or aperiodical updating is performed if the predetermined time period of use of the SSD device 300 set for the periodical updating and/or the trigger event(s) detected by the SSD device 300 fall within an ongoing encoding phase, with the periodical and/or aperiodical updating that in this case may be performed immediately after completing the ongoing encoding phase.

Alternatively, if the predetermined time period of use of the SSD device 300 set for the periodical updating and/or the trigger event(s) detected by the SSD device 300 fall within an ongoing encoding phase, the updating may still be performed concurrently with the encoding phase, in which case the ongoing encoding phase may for example take place based on the amount $(ET^{-1}A+C)$ instead of the updated amount $(ET^{-1}A+C)$.

Naturally, in order to satisfy local and specific requirements, a person skilled in the art may apply to the present invention as described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

What is claimed is:

1. A controller for a solid state storage device, wherein the controller is configured for encoding information bits with a Q-ary linear error correction code defined over a binary-extension Galois field $GF(2^k)$, wherein the Q-ary linear error correction code is defined by a quasi-cyclic parity-check matrix having an information section associated with the information bits and a parity section associated with parity bits, wherein the parity section has an approximate lower triangular form and comprises a plurality of circulants, the parity section comprises:
  a first circulant sub-matrix which comprises a first circulant having a first shift and being defined by a first parameter belonging to the Galois field $GF(2^k)$;
  a second circulant sub-matrix which has a triangular structure and comprises a second circulant having a second shift and being defined by a second parameter belonging to the Galois field $GF(2^k)$, said second parameter being the inverse of the first parameter, the second shift being equal to a difference between a number of rows of each circulant and the first shift;
  a third circulant sub-matrix which comprises a third circulant having a third shift and being defined by a third parameter belonging to the Galois field $GF(2^k)$; and
  a fourth circulant sub-matrix,
  the controller being configured for:
    determining a first set of parity-check bits according to the information bits, to said second and third circulant sub-matrices, and to a fourth circulant, the fourth circulant having a fourth shift and being defined by the multiplicative inverse of a fourth parameter given by a product between the first and third parameters, wherein the fourth shift is equal to a difference between said number of rows and said first and third shifts;
    determining a second set of parity-check bits according to the determined first set of parity-check bits, to said first and second circulant sub-matrices and to the information bits, and
    storing the information bits and the first and second sets of parity-check bits in memory cells of the solid state storage device.

2. The controller of claim 1, wherein the information section of the parity-check matrix comprises a fifth and a sixth circulant sub-matrices, the controller being configured to determine said first set of parity-check bits further according to said fifth and a sixth circulant sub-matrices.

3. The controller of claim 2, wherein the controller is configured to determine the first set of parity-check bits according to an amount given by:
  the sum between the fifth circulant sub-matrix, the sixth circulant sub-matrix, and the third circulant sub-matrix multiplied by the inverse of the second circulant sub-matrix.

4. The controller of claim 3, further configured to:
  periodically and/or aperiodically update the fifth and sixth circulant sub-matrices and said amount according to the updated fifth and sixth circulant sub-matrices, and
  determine the first set of parity-check bits according to said updated amount.

5. The controller of claim 1, wherein the information section of the parity-check matrix comprises a fifth circulant sub-matrix, the controller being configured to determine said second set of parity-check bits further according to said fifth circulant sub-matrix.

6. The controller of claim 1, wherein the Q-ary linear error correction code is a Q-ary "Low-Density Parity-Check" (LDPC) code.

7. A solid state storage device comprising, memory cells and a controller, wherein the controller is configured for encoding information bits with a Q-ary linear error correction code defined over a binary-extension Galois field $GF(2^k)$, wherein the Q-ary linear error correction code is defined by a quasi-cyclic parity-check matrix having an information section associated with the information bits and a parity section associated with parity bits, wherein the parity section has an approximate lower triangular form and comprises a plurality of circulants, wherein the parity section comprises:
- a first circulant sub-matrix which comprises a first circulant having a first shift and being defined by a first parameter belonging to the Galois field $GF(2^k)$;
- a second circulant sub-matrix which has a triangular structure and comprises a second circulant having a second shift and being defined by a second parameter belonging to the Galois field $GF(2^k)$, said second parameter being the inverse of the first parameter, the second shift being equal to a difference between a number of rows of each circulant and the first shift;
- a third circulant sub-matrix which comprises a third circulant having a third shift and being defined by a third parameter belonging to the Galois field $GF(2^k)$; and
- a fourth circulant sub-matrix, the controller being configured for:
- determining a first set of parity-check bits according to the information bits, to said second and third circulant sub-matrices, and to a fourth circulant, the fourth circulant having a fourth shift and being defined by the multiplicative inverse of a fourth parameter given by a product between the first and third parameters, wherein the fourth shift is equal to a difference between said number of rows and said first and third shifts, and
- determining a second set of parity-check bits according to the determined first set of parity-check bits, to said first and second circulant sub-matrices and to the information bits, and
- storing the information bits and the first and second sets of parity-check bits in the memory cells of the solid state storage device.

8. The solid state storage device of claim 7, wherein the information section of the parity-check matrix comprises a fifth and a sixth circulant sub-matrices, the controller being configured to determine said first set of parity-check bits further according to said fifth and a sixth circulant sub-matrices.

9. The solid state storage device of claim 8, wherein the controller is configured to determine the first set of parity-check bits according to an amount given by:
- the sum between the fifth circulant sub-matrix, the sixth circulant sub-matrix, and the third circulant sub-matrix multiplied by the inverse of the second circulant sub-matrix.

10. The solid state storage device of claim 9, wherein the controller is further configured to:
- periodically and/or aperiodically update the fifth and sixth circulant sub-matrices and said amount according to the updated fifth and sixth circulant sub-matrices, and
- determine the first set of parity-check bits according to said updated amount.

11. The solid state storage device of claim 7, wherein the information section of the parity-check matrix comprises a fifth circulant sub-matrix, the controller being configured to determine said second set of parity-check bits further according to said fifth circulant sub-matrix.

12. The solid state storage device of claim 7, wherein the Q-ary linear error correction code is a Q-ary "Low-Density Parity-Check" (LDPC) code.

* * * * *